United States Patent [19]
Tang

[11] Patent Number: 5,977,578
[45] Date of Patent: Nov. 2, 1999

[54] METHOD OF FORMING DYNAMIC RANDOM ACCESS MEMORY CIRCUITRY AND DYNAMIC RANDOM ACCESS MEMORY

[75] Inventor: Sanh Tang, Boise, Id.

[73] Assignee: Micron Technology, Inc., Boise, Id.

[21] Appl. No.: 09/119,330

[22] Filed: Jul. 20, 1998

Related U.S. Application Data

[63] Continuation of application No. 08/727,922, Oct. 9, 1996, Pat. No. 5,807,776, which is a continuation of application No. 08/568,356, Dec. 6, 1995, Pat. No. 5,568,356.

[51] Int. Cl.$^6$ .......................... H01L 29/68; H01L 27/108
[52] U.S. Cl. .......................... 257/296; 257/301; 257/303; 257/532; 257/534
[58] Field of Search .................................... 257/296, 301, 257/347, 350, 532, 534, 303, 304

[56] References Cited

U.S. PATENT DOCUMENTS

| | | | |
|---|---|---|---|
| 4,688,064 | 8/1987 | Ogura et al. | 257/301 |
| 4,829,017 | 5/1989 | Malhi | 437/79 |
| 4,855,952 | 8/1989 | Kiyosumi | 257/304 |
| 4,873,560 | 10/1989 | Sunami et al. | 257/304 |
| 5,097,381 | 3/1992 | Vo | 257/301 |
| 5,442,211 | 8/1995 | Kita | 257/305 |
| 5,442,584 | 8/1995 | Jeong et al. | 257/301 |
| 5,466,625 | 11/1995 | Hsieh et al. | 437/21 |
| 5,470,778 | 11/1995 | Nagata et al. | 437/203 |
| 5,504,027 | 4/1996 | Jeong et al. | 437/60 |
| 5,508,219 | 4/1996 | Bronner et al. | 437/52 |
| 5,508,541 | 4/1996 | Hieda et al. | 257/301 |
| 5,525,531 | 6/1996 | Bronner et al. | 437/52 |
| 5,555,520 | 9/1996 | Sudo et al. | 257/304 |
| 5,606,188 | 2/1997 | Bronner et al. | 257/304 |
| 5,650,957 | 7/1997 | Choi | 257/301 |
| 5,661,320 | 8/1997 | Moriya | 257/301 |
| 5,770,875 | 6/1998 | Assaderaghi et al. | 257/301 |

FOREIGN PATENT DOCUMENTS

| | | | |
|---|---|---|---|
| 363196071 | 8/1988 | Japan | 257/303 |
| 405136366 | 6/1993 | Japan | 257/301 |

OTHER PUBLICATIONS

Nishihara, Toshiyuki et al., "A Buried Capacitor Cell With Bonded SOI For 256–Mbit and 1–Gbit DRAMs", Solid State Technology, Jun. 1994, pp. 89–94.

*Primary Examiner*—Brian Dutton
*Assistant Examiner*—Hung Van Duong
*Attorney, Agent, or Firm*—Wells, St. John, Roberts, Gregory & Matkin P.S.

[57] ABSTRACT

A semiconductor processing method of forming dynamic random access memory circuitry includes, a) providing an electrically conductive capacitor cell plate substrate; b) providing an electrical insulative layer over the cell plate; c) providing a layer of semiconductive material on the insulative layer thereby defining a semiconductor-on-insulator (SOI) layer; d) patterning and etching the SOI layer to define active area region islands and isolation trenches between the islands; e) filling the isolation trenches with insulative material; f) providing capacitor openings through the SOI layer and insulative layer into the cell plate substrate; g) providing a capacitor dielectric layer over the cell plate substrate within the capacitor openings; h) providing respective capacitor storage nodes over the dielectric layer within the capacitor openings, the respective storage nodes being in ohmic connection with the SOI layer; i) after providing the storage nodes, filling any remaining portions of the capacitor container openings with insulative material; j) providing a gate dielectric layer atop the SOI layer islands; k) providing conductive word lines over the gate dielectric layer on the islands and over the filled isolation trenches; l) providing opposing FET source and drain regions within the SOI layer; and m) providing bit lines outwardly of the word lines, the bit lines connecting with selected drain regions. Also contemplated is a DRAM array having sources and drains formed within an SOI layer, wherein capacitors of the array comprise trenches formed within a monocrystalline substrate, with the substrate comprising a common cell plate of the capacitors.

5 Claims, 7 Drawing Sheets

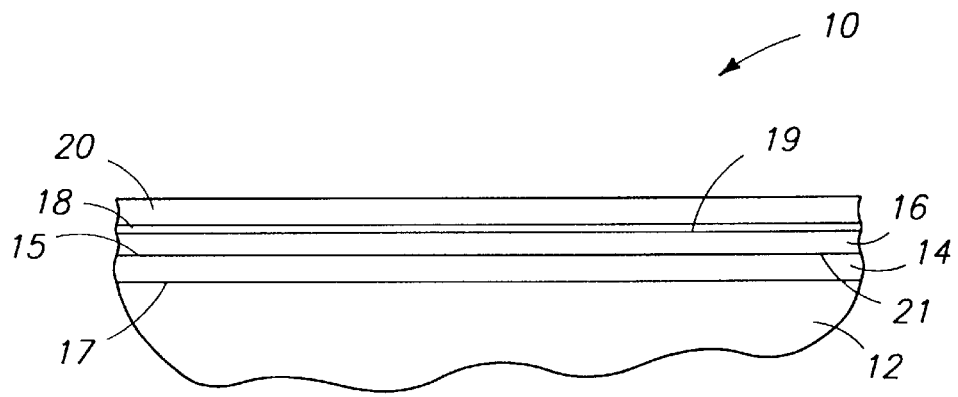
_Fig. 1_
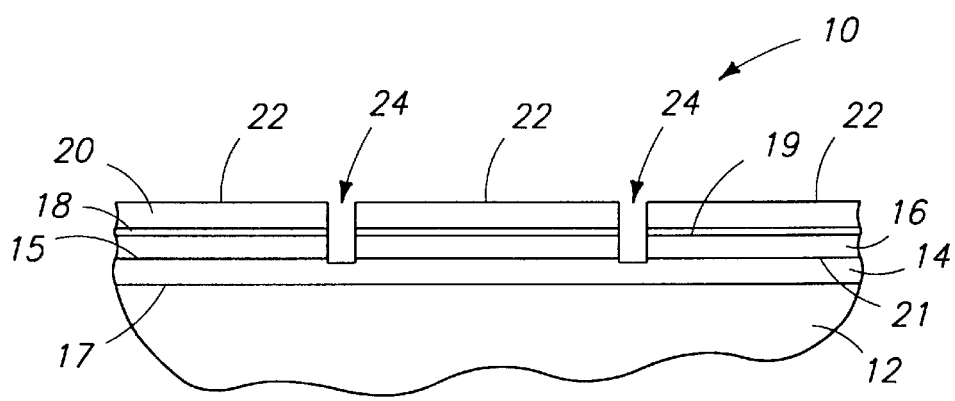
_Fig. 2_
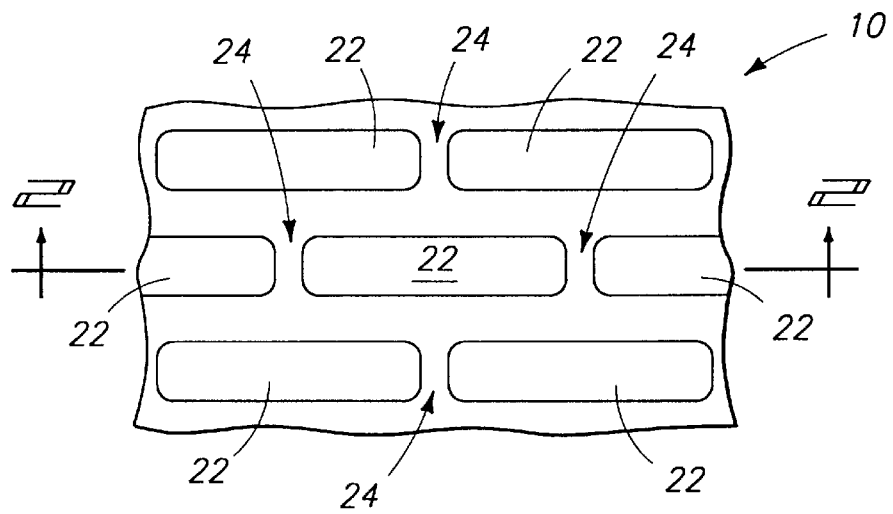
_Fig. 3_

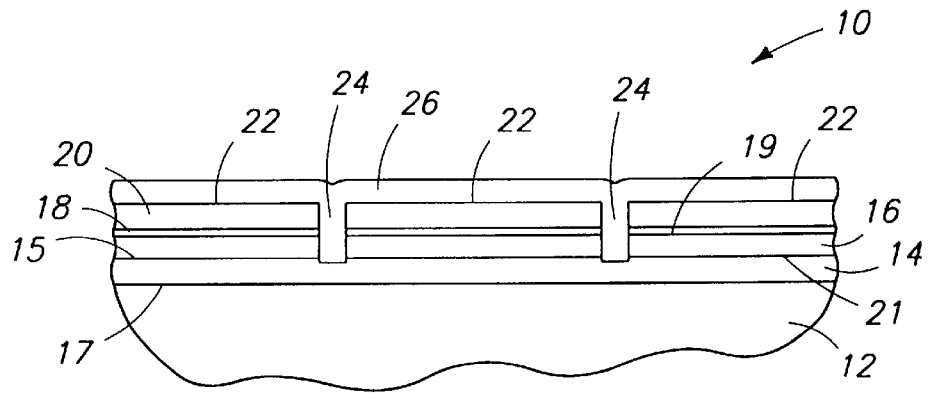
_Fig 4_
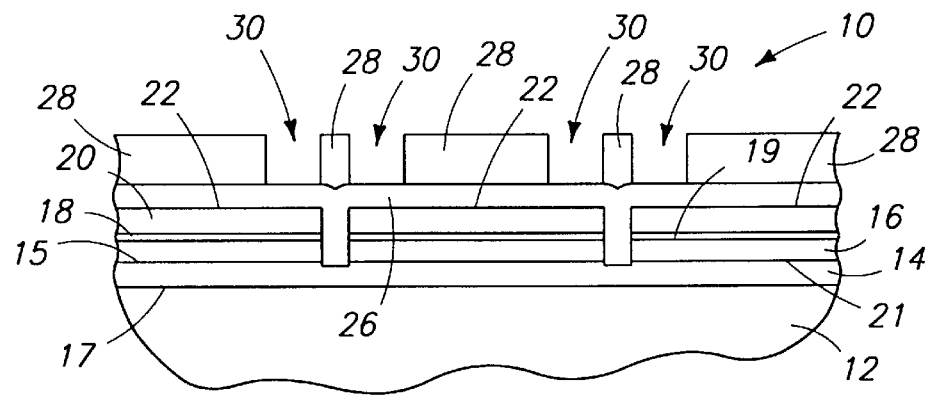
_Fig 5_
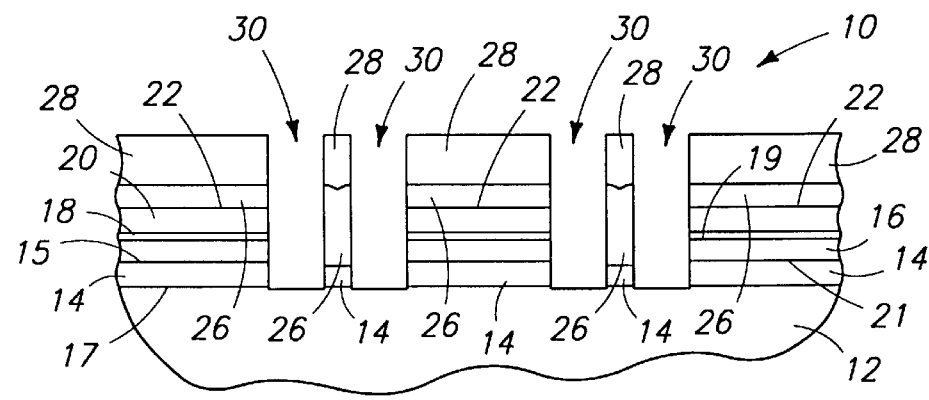
_Fig 6_

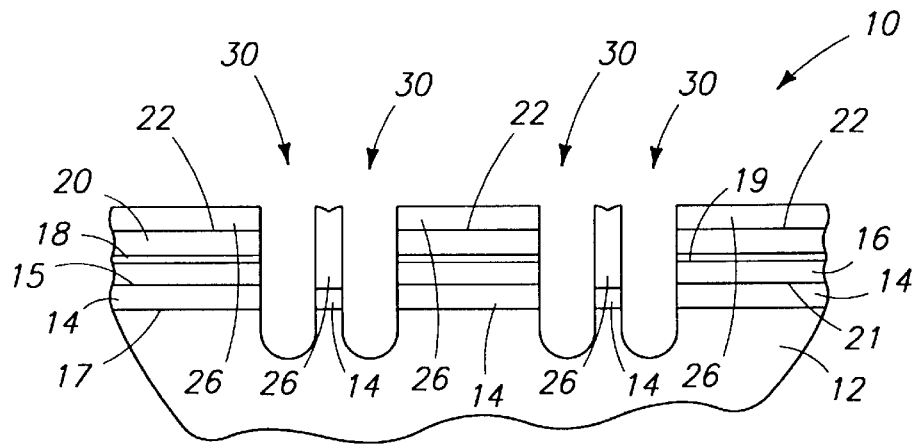
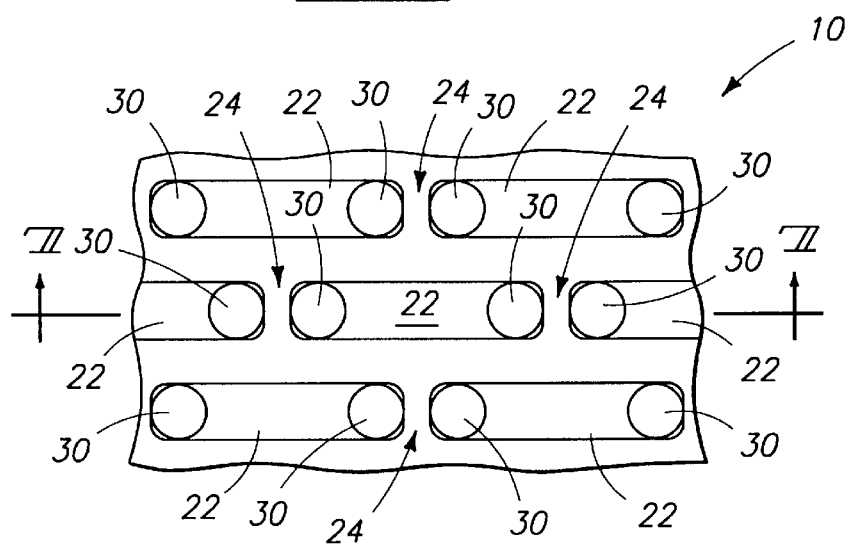
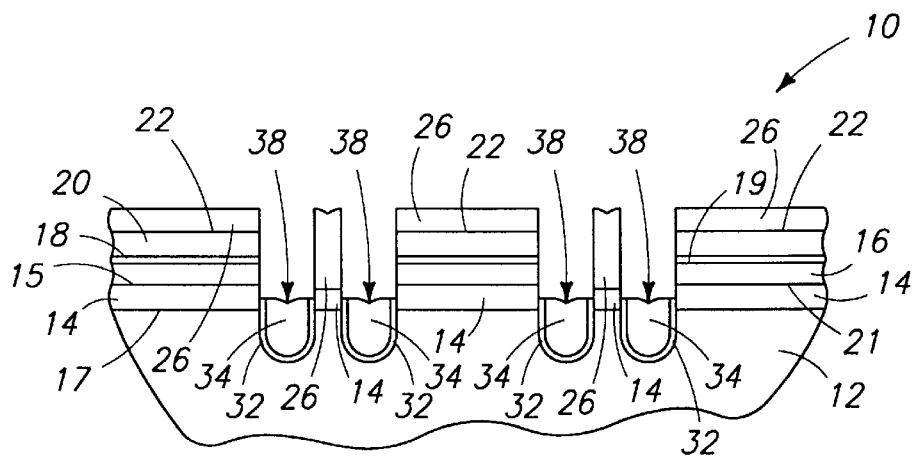

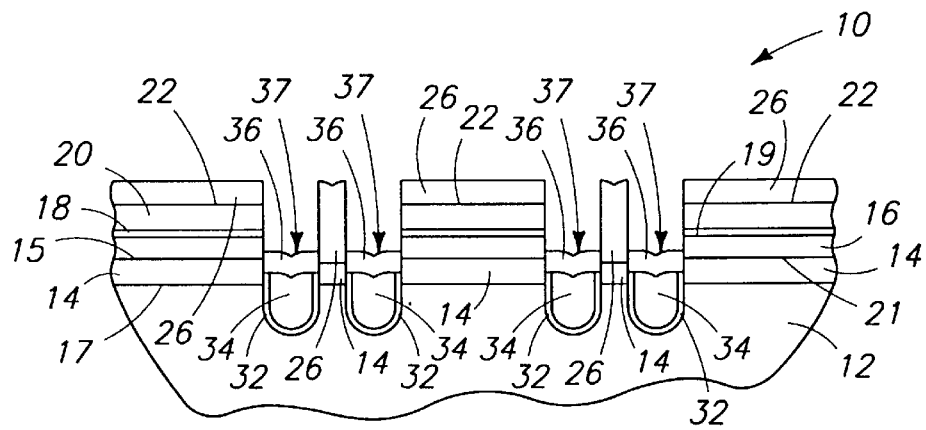
F I G. 10
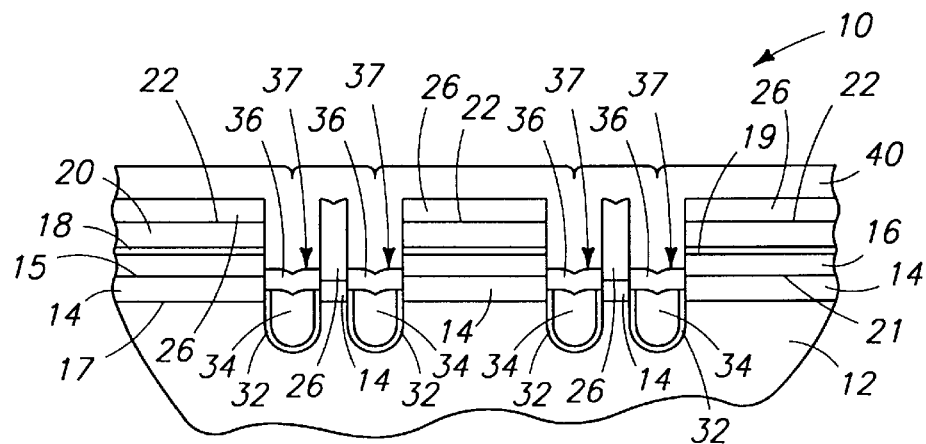
F I G. 11
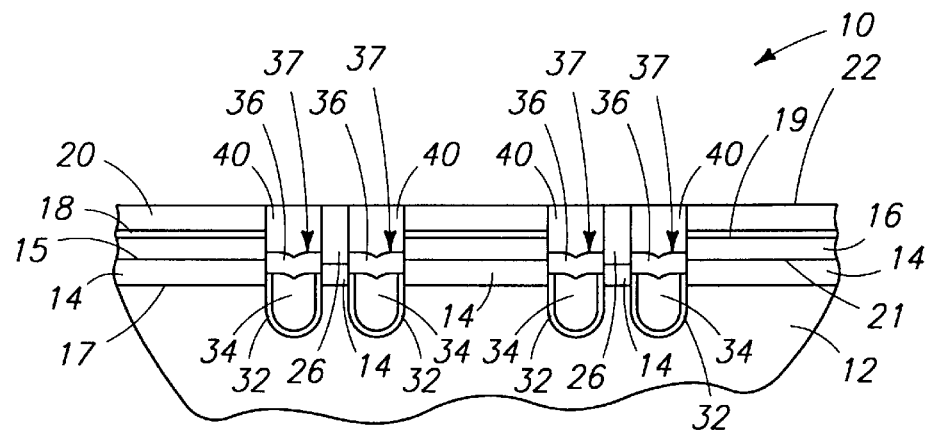
F I G. 12

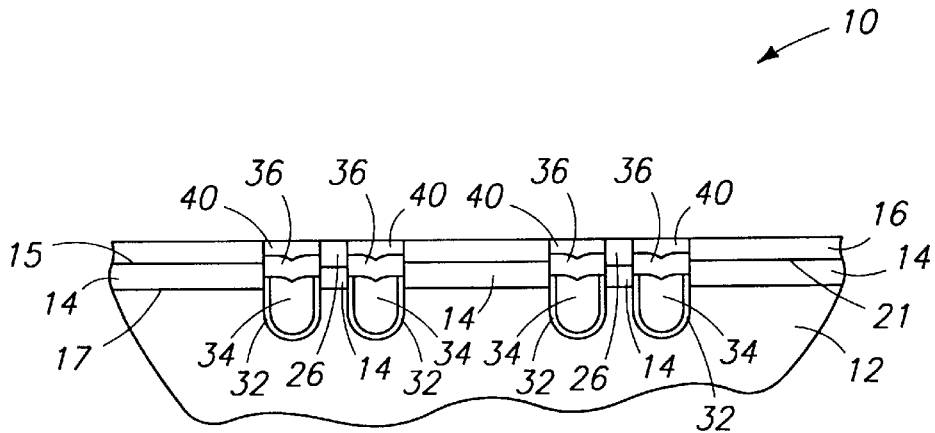
_FIG. 13_
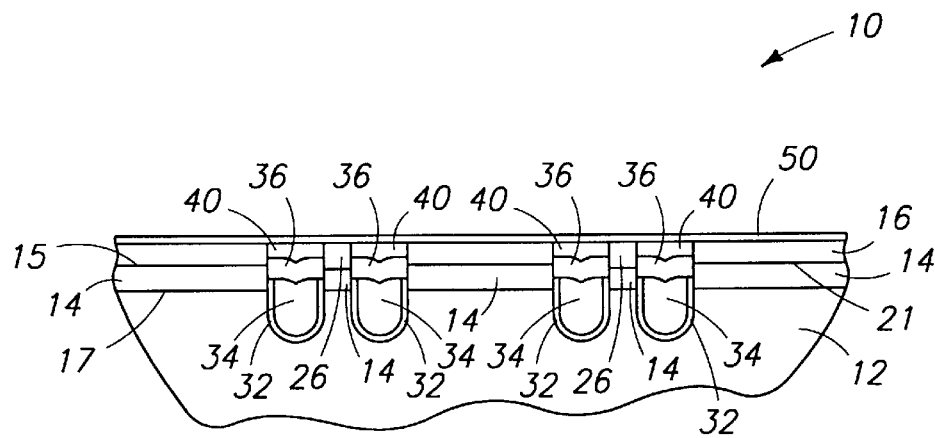
_FIG. 14_
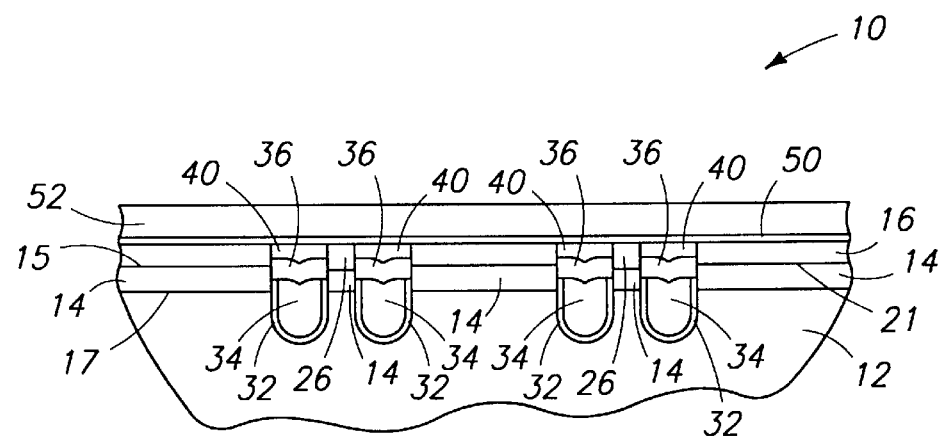
_FIG. 15_

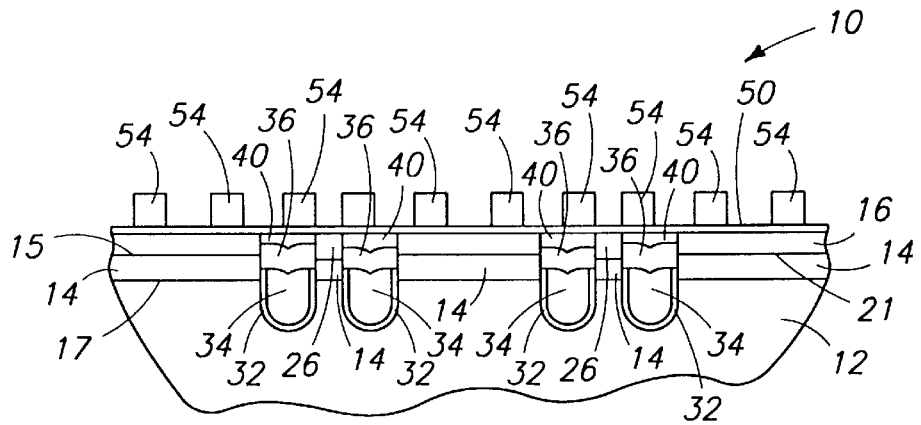
_FIG. 16_
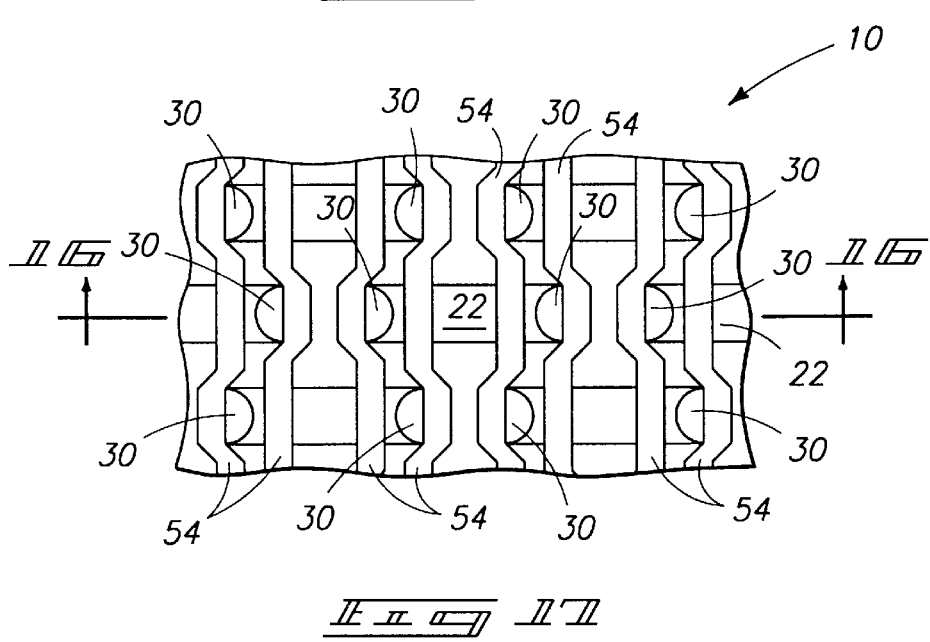
_FIG. 17_
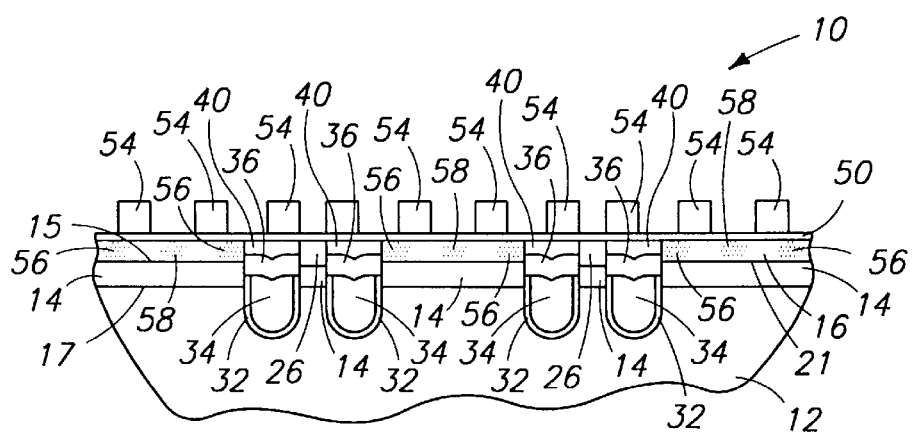
_FIG. 18_

5,977,578

METHOD OF FORMING DYNAMIC RANDOM ACCESS MEMORY CIRCUITRY AND DYNAMIC RANDOM ACCESS MEMORY

RELATED PATENT DATA

This application is a continuation application of Ser. No. 08/727,922, which was filed on Oct. 9, 1966, now U.S. Pat. No. 5,807,776 September 1998 which is a continuation of Ser. No. 08/568,356 filed Dec. 6, 1985, now U.S. Pat. No. 5,585,285 December 1996.

TECHNICAL FIELD

This invention relates to methods of forming dynamic random access memory circuitry and to dynamic random access memory circuitry.

BACKGROUND OF THE INVENTION

High density integrated circuitry is principally fabricated from semiconductor wafers. Upon fabrication completion, a wafer contains a plurality of identical discrete die areas which are ultimately cut from the wafer to form individual chips. Die areas or cut dies are tested for operability, with good dies being assembled into separate encapsulating packages which are used in end-products or systems.

One type of integrated circuitry comprises memory. The basic unit of semiconductor memory is the memory cell. Capable of storing a single bit information, the memory cell has steadily shrunk in size to enable more and more cells per area of a semiconductor substrate or wafer. Such enables integrated memory circuitry to be more compact, as well as faster in operation.

Example semiconductor memories include ROMs, RAMs, PROMs, EPROMs and EEPROMs. Some emphasize compactness and economy over speed. Others focus on lightening-fast operation. Some store data indefinitely, while others are so temporary they must be refreshed hundreds of times every second. The smallest memory cell comprises the single transistor capacitor of a dynamic random access memory (DRAM).

BRIEF DESCRIPTION OF THE DRAWINGS

Preferred embodiments of the invention are described below with reference to the following accompanying drawings.

FIG. 1 is a diagrammatic fragmentary sectional view of a semiconductor wafer fragment at one processing step in accordance with the invention.

FIG. 2 is a view of the FIG. 1 wafer at a processing step subsequent to that shown by FIG. 1.

FIG. 3 is a top view of FIG. 2.

FIG. 4 is a view of the FIG. 1 wafer at a processing step subsequent to that shown by FIG. 2.

FIG. 5 is a view of the FIG. 1 wafer at a processing step subsequent to that shown by FIG. 4.

FIG. 6 is a view of the FIG. 1 wafer at a processing step subsequent to that shown by FIG. 5.

FIG. 7 is a view of the FIG. 1 wafer at a processing step subsequent to that shown by FIG. 6.

FIG. 8 is a top view of FIG. 7.

FIG. 9 is a view of the FIG. 1 wafer at a processing step subsequent to that shown by FIG. 7.

FIG. 10 is a view of the FIG. 1 wafer at a processing step subsequent to that shown by FIG. 9.

FIG. 11 is a view of the FIG. 1 wafer at a processing step subsequent to that shown by FIG. 10.

FIG. 12 is a view of the FIG. 1 wafer at a processing step subsequent to that shown in FIG. 11.

FIG. 13 is a view of the FIG. 1 wafer at a processing step subsequent to that shown by FIG. 12.

FIG. 14 is a view of the FIG. 1 wafer at a processing step subsequent to that shown by FIG. 13.

FIG. 15 is a view of the FIG. 1 wafer at a processing step subsequent to that shown by FIG. 14.

FIG. 16 is a view of the FIG. 1 wafer at a processing step subsequent to that shown by FIG. 17.

FIG. 17 is a top view of FIG. 16.

FIG. 18 is a view of the FIG. 1 wafer at a processing step subsequent to that shown by FIG. 16.

DETAILED DESCRIPTION OF THE PREFERRED EMBODIMENTS

Figure 19:
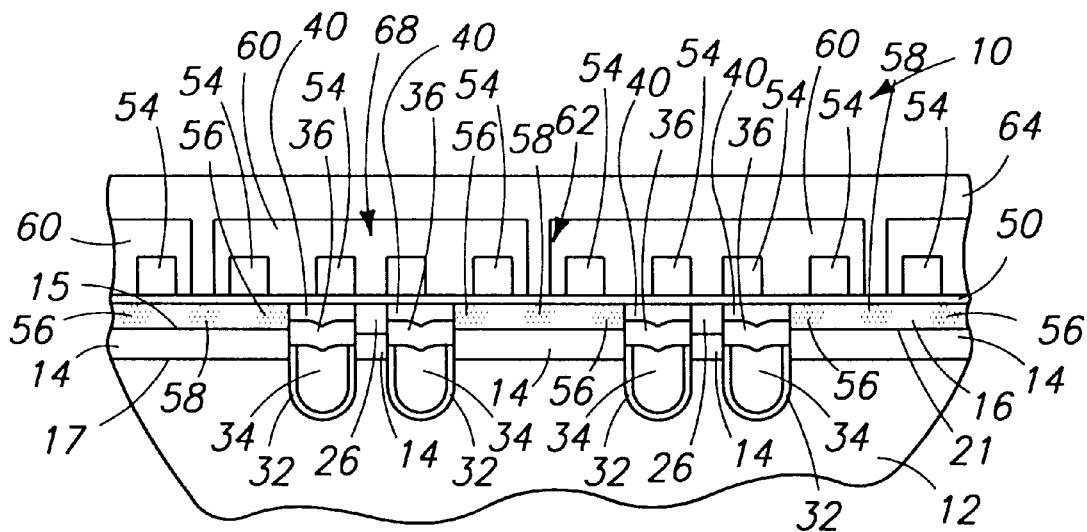
FIG. 19 is a view of the FIG. 1 wafer at a processing step subsequent to that shown by FIG. 18.
Figure 20:
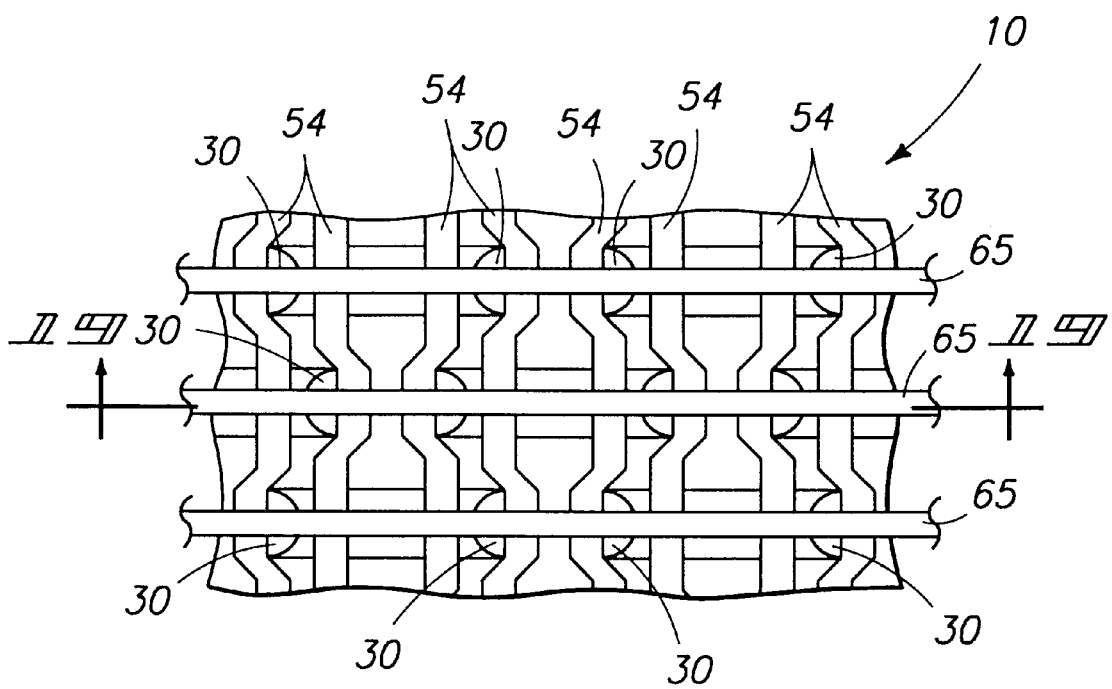
FIG. 20 is a top view of FIG. 19.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming dynamic random access memory circuitry comprises the following steps:

providing an electrically conductive capacitor cell plate substrate;

providing an electrically insulative layer over the cell plate;

providing a layer of semiconductive material on the electrically insulative layer thereby defining a semiconductor-on-insulator (SOI) layer;

patterning and etching the SOI layer to define active area region islands and isolation trenches between the islands;

filling the isolation trenches with electrically insulative material;

providing capacitor openings through the SOI layer and electrically insulative layer into the capacitor cell plate substrate;

providing respective capacitor storage nodes over the capacitor dielectric layer within the capacitor openings, the respective storage nodes being in ohmic electrical connection with the SOI layer;

after providing the capacitor storage nodes, filling any remaining portions of the capacitor container openings with electrically insulative material;

providing a gate dielectric layer atop the SOI layer islands;

providing electrically conductive word lines over the gate dielectric layer on the islands and over the filled isolation trenches;

providing bit lines outwardly of the word lines, the bit lines electrically connecting with selected drain regions.

In accordance with another aspect of the invention, a dynamic random access memory circuit array comprises:

an array of word lines and bit lines;

the word lines having associated source regions and drain regions;

the bit lines being in ohmic electrical connection with selected of the drain regions;

the source regions and the drain regions within the array being formed in a semiconductor-on-insulator layer;

a monocrystalline semiconductor substrate; the word lines, bit lines, source regions and drain regions being formed outwardly of the semiconductor substrate; and respective trench storage capacitors associated with selected of the silicon-on-insulator source regions; the trench capacitors respectively comprising a storage node plate, a capacitor dielectric layer and a cell plate; the storage node plates respectively comprising a trench formed within the monocrystalline semiconductor substrate and a conductive material within the trench; the respective capacitor dielectric layers being received within the respective trenches and interposed between the conductive material and monocrystalline semiconductor substrate; the cell plate comprising the monocrystalline semiconductor substrate.

More particularly with reference to the figures, FIG. 1 illustrates a semiconductor wafer fragment 10 at one step in a method of forming dynamic random access memory circuitry in accordance with the invention. Such comprises a lower electrically conductive layer 12. Layer 12 might comprise a conductively doped region of the bulk wafer substrate, or a separately deposited or provided conductive layer. In the preferred embodiment, layer 12 comprises a bulk substrate region of a monocrystalline semiconductor material, such as the bulk region of a monocrystalline silicon wafer. An example dopant concentration is $1 \times 10^{20}$ to $1 \times 10^{21}$ ions/cm$^3$. Regardless and in accordance with the preferred aspect of the invention, layer 12 constitutes an electrically conductive capacitor cell plate substrate.

An electrically insulative layer 14 is provided over cell plate 12. An example preferred material is silicon dioxide and deposited to a thickness of 3000 Angstroms. For purposes of the continuing discussion, insulative layer 14 includes an outer surface 15 and an inner surface 17. A layer 16 of semiconductive material is provided on electrically insulative layer 14, thereby defining a semiconductor-on-insulator (SOI) layer. Such preferably comprises conductively doped monocrystalline silicon deposited to an example thickness of 3000 Angstroms and having an intrinsic dopant impurity concentration of $1 \times 10^{15}$ ions/cm$^3$. For purposes of the continuing discussion, SOI layer 16 includes an outer surface 19 and an inner surface 21. The above described construction would preferably be provided for processing by purchasing the same from a silicon substrate vendor under a desired specification. A protective capping layer 18 is provided outwardly of SOI layer 16. An example and preferred material is silicon dioxide having a thickness of 250 Angstroms. Subsequently, an etch stop layer 20 is provided over capping layer 18, and thus over SOI layer 16. An example material is $Si_3N_4$ deposited to a thickness of 700 Angstroms.

Referring to FIGS. 2 and 3, SOI layer 16, capping layer 18 and etch stop layer 20 are patterned and etched to define active area region islands 22 and isolation trenches 24 between islands 22. Such isolation trenches 24 are preferably provided to effectively or substantially stop relative to electrically insulative layer 14.

Referring to FIG. 4, isolation trenches 24 are filled with an electrically insulative material preferably by depositing an electrically insulative layer 26. Again, a preferred material for layer 26 is doped or undoped $SiO_2$, deposited to a thickness effective to assure complete filling of trenches 24. An example deposited thickness is 1000 Angstroms.

Capacitor openings are provided through the SOI layer and electrically insulative layer into the capacitor cell plate substrate. Preferably, and initially with reference to FIG. 5, such is accomplished by initially depositing and patterning a layer of photoresist 28 over insulating layer 26 filing isolation trenches 24 to define a pattern of openings 30 which will comprise resultant capacitor openings. Referring to FIG. 6, and with photoresist layer 28 in place, etching is conducted through insulating layer 26, etch stop layer 20, capping layer 18, SOI layer 16 and electrically insulative layer 14 substantially stopping on capacitor cell plate substrate 12.

Referring to FIGS. 7 and 8, photoresist layer 28 is stripped from outwardly of insulating layer 26, and the wafer then subjected to a clean step. Subsequently, cell plate substrate 12 is etched into using insulating layer 26 filling isolation trenches 24 as a hard mask for such cell plate etching. It is preferred to strip the photoresist before subsequent etching of silicon within substrate 12 to avoid resist or other material contaminating the container opening and the underlying silicon.

Referring to FIG. 9, a capacitor dielectric layer 32 is deposited or grown within capacitor openings 30 over cell plate substrate 12. An example and preferred composition for layer 32 is a sandwich of oxide-nitride-oxide. An example preferred thickness is from 80 Angstroms to 100 Angstroms. Subsequently, a first conductive layer 34 is provided over capacitor dielectric layer 32 within capacitor openings 30. Such preferably comprises in situ conductively doped polysilicon which is deposited to fill the respective capacitor openings 30. Thereafter, such layer is etched as indicated to stop below upper surface 15 of electrically insulative layer 14, but above bottom surface 17 of insulative layer 14. Thus, the first conductive layer 34 has an outer surface 38 which is positioned between outer and inner surfaces 15 and 17, respectively, of electrically insulative layer 14.

Referring to FIG. 10, a second electrically conductive layer 36, preferably again in situ conductively doped polysilicon, is provided within capacitor openings 30 in ohmic electric connection with first conductive layer 34 and with SOI layer 16. Layer 36 is subsequently etched back to provide an outer second layer surface 37 which is positioned below SOI layer outer surface 19, yet above SOI layer 16 inner surface 21. Thus, conductive layers 34 and 36 constitute but one example method of providing respective capacitor storage nodes over capacitor dielectric layers 32 within capacitor openings 30 which are in ohmic electrical connection with SOI layer 16.

Referring to FIG. 11, a layer 40 of electrically insulating material is deposited to fill any remaining portions of capacitor container openings 30 with an electrically insulative material. Such material preferably, again, comprises doped or undoped $SiO_2$.

Referring to FIG. 12, electrically insulative layer 40 and electrically insulative layer 26 are etched in a common step using etch stop layer 20 as an etch stop to such etching. Example and preferred techniques include resist etch back, or chemical-mechanical polishing.

Referring to FIG. 13, further etching or chemical-mechanical polishing is conducted in a manner effective to remove etch stop layer 20 and capping layer 18 from SOI layer islands 22, effectively stopping on SOI layer 16.

Referring to FIG. 14, a gate dielectric layer 50 is provided atop SOI layer islands 22 over SOI layer 16. Such preferably comprises $SiO_2$, with an example thickness being 60 Angstroms to 80 Angstroms.

Referring to FIG. 15, an electrically conductive layer 52 is deposited over gate dielectric layer 50. Such preferably comprises conductively doped polysilicon having a metal cap provided thereover for formation of a higher conductive metal silicide cap.

Referring to FIGS. 16 and 17, electrically conductive layer 52 is patterned to define, an array of word lines 54 over gate dielectric layer 50 on islands 22 and over filled isolation trenches 24.

Referring to FIG. 18, appropriate masking is conducted to provide opposing FET source regions 56 and drain regions 58 within SOI layer 16. LDD or other halo implant regions and/or anisotropically etched sidewall spacers could of course be provided as desired by the artisan.

Referring to FIGS. 19 an 20, a planarized electrically insulating layer 60 is provided, and bit contact opening 62 provided therein to drain regions 58. A layer of electrically conductive material 64 is subsequently deposited and patterned to define an array of bit lines 65 outwardly of word lines 54, with bit lines 65 electrically connecting with selected drain regions 58 through contact openings 62.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A memory cell comprising:

a bulk monocrystalline semiconductor material substrate;

an insulator layer outwardly of the bulk substrate;

a semiconductor-on-insulator (SOI) layer outwardly of the insulator layer, the SOI layer having an outer surface and an inner surface and wherein the bulk monocrystalline semiconductor material substrate and the SOI layer define a capacitor container opening;

field effect transistor source and drain regions formed within the SOI layer;

a capacitor received source within the capacitor container opening and extending into the bulk substrate, the capacitor comprising an inner conductive capacitor cell plate, an outer conductive storage node plate and a capacitor dielectric layer therebetween; and a conductive interconnect layer received entirely within the capacitor container opening and outwardly of and in electrical connection with the storage node plate and one of the source and drain regions of the SOI layer, the interconnect layer having an outer surface which is positioned between the inner surface and the outer surface of the SOI layer.

2. The memory cell of claim 1 further comprising insulating material received outwardly of the interconnect layer and between the inner surface and outer surface of the SOI layer.

3. A memory cell comprising:

a bulk monocrystalline semiconductor material substrate;

an insulator layer outwardly of the bulk substrate;

a semiconductor-on-insulator (SOI) layer outwardly of insulator layer, the SOI layer having an outer surface and an inner surface, and wherein the bulk monocrystalline semiconductor material substrate, insulator layer, and SOI layer define a capacitor container opening;

field effect transistor source and drain regions formed within the SOI layer;

a capacitor received within the capacitor container opening and extending into the bulk substrate, the capacitor comprising a conductive capacitor cell plate comprising at least a portion of the bulk substrate, a conductive storage node plate and a capacitor dielectric layer therebetween, and wherein the conductive storage node plate and capacitor dielectric layer are entirely positioned within the capacitor container opening; and a conductive interconnect layer received outwardly of and in electrical connection with the storage node plate and one of the source and drain regions of the SOI layer, the conductive interconnect layer positioned entirely within the capacitor container opening, the conductive interconnect layer having an outer surface which is positioned between the inner surface and the outer surface of the SOI layer.

4. The memory cell of claim 3 further comprising insulating material received outwardly of the interconnect layer and between the inner surface and the outer surface of the SOI layer.

5. A dynamic random access memory circuit array, comprising:

an electrically conductive capacitor cell plate substrate;

a first electrically insulative layer over the electrically conductive capacitor cell plate substrate, the first electrically insulative layer having a lower surface which is juxtaposed relative to the electrically conductive capacitor cell plate substrate, and an opposite, upper surface;

a layer of semiconductive material on the first electrically insulative layer, the layer of semiconductive material having a lower surface juxtaposed relative to the upper surface of the first electrically insulative layer, and an opposite upper surface, and wherein the electrically conductive capacitor cell plate substrate first, electrically insulative layer, and the layer of semiconductive material define active area region islands, isolation trenches between the active area region islands, and capacitor container openings which extend through the layer of semiconductive material and the first electrically insulative layer and into the electrically conductive capacitor cell plate substrate, and wherein the first electrically insulative and semiconductive layers are exposed in the capacitor container openings;

a capacitor dielectric layer positioned entirely within each of the capacitor container openings, and which is disposed in covering relation relative to the exposed electrically conductive capacitor cell plate substrate, and in partial covering relation relative to the exposed first electrically insulative layer which is juxtaposed relative to the electrically conductive capacitor cell plate substrate;

a first conductive layer positioned entirely within the respective capacitor container openings and disposed in substantially covering relation relative to the capacitor dielectric layer, the first conductive layer having an upper surface which is positioned elevationally outwardly of the lower surface, and elevationally inwardly relative to the upper surface of the first electrically insulative layer which is juxtaposed relative to the electrically conductive capacitor cell plate substrate;

a second conductive layer positioned entirely within each of the capacitor container openings and which is disposed in ohmic electrical connection with the first conductive layer and the layer of semiconductive material which is exposed, the second conductive layer having an upper surface which is positioned elevationally outwardly of the lower surface, and elevationally inwardly relative to the upper surface of the layer of semiconductive material;

a second electrically insulative layer positioned entirely within each of the capacitor container openings and which is disposed in substantially covering relation relative to the upper surface of the second conductive layer;

a gate dielectric layer positioned outwardly of and in covering relation relative to the layer of semiconductor material, the capacitor container openings and the second electrically insulative layer which is disposed in covering relation relative to the upper surface of the second conductive layer;

an array of word lines positioned on the gate dielectric layer and over the active area region islands, and isolation trenches;

source and drain regions located in the layer of the semiconductor material and associated with selected word lines;

a third electrically insulative layer positioned over the array of word lines and further defining contact openings to selected drain regions; and an array of bit lines positioned on the electrically insulative layer which is positioned over the array of word lines and electrically connecting with selected drain regions through the contact openings.

* * * * *

UNITED STATES PATENT AND TRADEMARK OFFICE
CERTIFICATE OF CORRECTION

PATENT NO.    : 5,977,578
DATED         : November 2, 1999
INVENTOR(S)   : Sanh Tang It is certified that error appears in the above-identified patent and that said Letters Patent is hereby corrected as shown below:

Column 1,
Line 29, after the word "bit", insert the word -- of --.

Column 4,
Line 43, after the word "second", insert the word -- conductive --.

Column 5,
Line 42, after the word "received", DELETE the word "source".
Line 63, before the first word "insulator", insert the word -- the --.

Signed and Sealed this

Eighteenth Day of September, 2001

*Attest:*

*Attesting Officer*

NICHOLAS P. GODICI
*Acting Director of the United States Patent and Trademark Office*